(12) United States Patent
Hsieh

(10) Patent No.: US 12,283,832 B2
(45) Date of Patent: Apr. 22, 2025

(54) TOTAL VOLTAGE FOLLOW-UP CHARGING METHOD AND SYSTEM

(71) Applicant: TAIWAN TRUEWIN TECHNOLOGY CO., LTD., Hsinchu (TW)

(72) Inventor: Fang-Chi Hsieh, Hsinchu (TW)

(73) Assignee: TAIWAN TRUEWIN TECHNOLOGY CO., LTD., Hsinchu (TW)

(*) Notice: Subject to any disclaimer, the term of this patent is extended or adjusted under 35 U.S.C. 154(b) by 617 days.

(21) Appl. No.: 17/574,596

(22) Filed: Jan. 13, 2022

(65) Prior Publication Data
US 2023/0223765 A1  Jul. 13, 2023

(51) Int. Cl.
*H02J 7/16* (2006.01)
*G01R 31/3835* (2019.01)
(Continued)

(52) U.S. Cl.
CPC ........ *H02J 7/0016* (2013.01); *G01R 31/3835* (2019.01); *G01R 31/396* (2019.01); *H02J 7/007182* (2020.01)

(58) Field of Classification Search
CPC ...... H02J 7/0048; H02J 7/0014; H02J 7/0013; H02J 7/0016; H02J 7/0029; H02J 7/0047; H02J 7/005; H02J 7/0019; H02J 7/0063; H02J 7/1423; H02J 7/00036; H02J 7/0024; H02J 7/0031; H02J 7/00302; H02J 7/00712; H02J 7/00; H02J 7/00714; H02J 7/007194; H02J 7/00032; H02J 7/007182; H02J 7/345; H02J 7/00304; H02J 7/00308; H02J 7/007; H02J 7/00047; H02J 7/342; H02J 2310/48; H02J 7/00306; H02J 7/0025; H02J 7/00309; H02J 9/061; H02J 2310/44; H02J 9/062; H02J 7/0069; H02J 7/143; H02J 7/1492; H02J 7/34; H02J 2207/20; H02J 3/381; H02J 7/0018; H02J 7/0068; H02J 7/04; H02J 7/24; H02J 7/35; H02J 1/122; H02J 13/00002; H02J 2207/50; H02J 2310/16; H02J 3/16; H02J 3/1807; H02J 3/1842; H02J 7/0034; H02J 7/0036; H02J 7/0042; H02J 7/0045; H02J 7/0049; H02J 9/08; H02J 1/02; H02J 1/14; H02J 13/00001; H02J 13/00016; H02J 13/00026; H02J 2207/10; H02J 2207/30;
(Continued)

(56) References Cited

U.S. PATENT DOCUMENTS

| | | | |
|---|---|---|---|
| 2016/0089994 A1* | 3/2016 | Keller | B60L 53/14 320/153 |
| 2016/0190830 A1* | 6/2016 | Kuhlmann | H02J 7/007194 320/116 |
| 2017/0047747 A1* | 2/2017 | Kufner | H02J 7/0019 |

* cited by examiner

Primary Examiner — Binh C Tat
(74) Attorney, Agent, or Firm — HAUPTMAN HAM, LLP

(57) ABSTRACT

The present invention discloses a method and system for charging rechargeable battery cells in series. When the voltage of a specific battery cell is too high, discharge the specific battery cell, and at the same time let other battery cells with lower voltage continue to charge, so that each battery cell in series can be charged to almost the same level. This invention designs in a "Total voltage follow-up charging method", a Battery Manage System (BMS) detects total voltage of the series-connected battery in real-time and modifies an "equalizing trigger voltage", as the total voltage drifts the equaling function still works well.

5 Claims, 4 Drawing Sheets

(51) Int. Cl.
*G01R 31/396* (2019.01)
*H02J 7/00* (2006.01)

(58) Field of Classification Search
CPC ............... H02J 2300/10; H02J 2300/24; H02J 2300/28; H02J 2300/30; H02J 2300/40; H02J 2310/40; H02J 3/28; H02J 3/32; H02J 3/388; H02J 7/00034; H02J 7/00041; H02J 7/007184; H02J 7/007192; H02J 7/14; H02J 7/1415; H02J 7/18; H02J 13/00022; H02J 7/02; G01R 31/396; G01R 31/389; G01R 31/392; G01R 31/385; G01R 31/3835; G01R 31/3647; G01R 31/379; G01R 31/371; G01R 19/16542; G01R 31/382; G01R 31/387; H01M 10/482; H01M 10/4257; H01M 2220/20; H01M 10/0525; H01M 2220/30; H01M 16/006; H01M 2008/1095; H01M 8/04559; H01M 8/04589; H01M 8/04679; H01M 8/04753; H01M 8/0494; H01M 10/4285; H01M 10/4228; H01M 8/04955; H01M 8/1011
USPC .................................................. 320/118–125
See application file for complete search history.

TOTAL VOLTAGE FOLLOW-UP CHARGING METHOD AND SYSTEM

BACKGROUND

Technical Field

The present invention discloses a method and system for charging series battery cells, in particular for charging lithium-ion battery cells connected in series.

Description of Related Art

FIG. 1 shows a prior art.

Here it is assumed that the charging voltage of 544V with charging current 15A, to one-hundred and sixty (160) pieces of lithium-ion batteries in series being charged as an example. In the prior art technique of FIG. 1, it describes as follows:

Step 1: setting charging voltage/current (544V/15A) to a charger;

Step 2: charging to 160 pieces of lithium-ion series battery cells:

Step 3: checking the total voltage and determining whether it is greater than 544V? If no, going back to step 2; and if yes, going to step 4:

Step 4: Ending the charging process.

After the battery cells are charged according to the prior art technique, although the total voltage meets the demand, the voltage distribution among individual battery cells is uneven. For example, by calculating with 544V/160=3400 mV, the average voltage for each battery cell is 3400 mV. Among the series battery cells, assuming that one of the batteries is found to be 3200 mV, there must be another one being with 3600 mV, so that the average voltage will be equal to 3400 mV. The voltage uneven distribution for individual battery is because of the intrinsic differences of the structure of each battery cell, comprising material differences, manufacturing process deviation . . . etc., that is why though under the same charging environment, yet series battery cells have uneven voltage distribution.

FIG. 2A shows uneven charged batteries according to the prior art.

FIG. 2A shows that after the battery cells connected in series are charged by the conventional technique in FIG. 1, different battery cells will have different charging states. For example, the voltage of the battery cell 31 is lower than the voltage average line L1, the voltage of the battery cell 32 is higher than the voltage average line L1, and the voltage of the battery cell 33 is approximately equal to the voltage average line L1. The difference in voltage level among series battery cells causes the overall power supply efficiency to deteriorate.

SUMMARY OF THE INVENTION

The present invention discloses a total voltage follow-up charging method and system for series battery cells. According to the equalizing program of the present invention, discharge can be performed over a battery cell with a voltage higher than an "equalizing trigger voltage", while allowing the other batteries with lower voltage continuing to be charged. Each battery of the series battery cells can be charged almost the same level finally according to the present invention.

The present invention detects the actual total voltage of the series battery cells time to time, and immediately feeds back to modify the "equalizing trigger voltage". When the total voltage of the series battery cells drifts, the present invention effectively proceeds voltage equalization for the series battery cells.

DETAILED DESCRIPTION OF THE INVENTION

Figure 1:
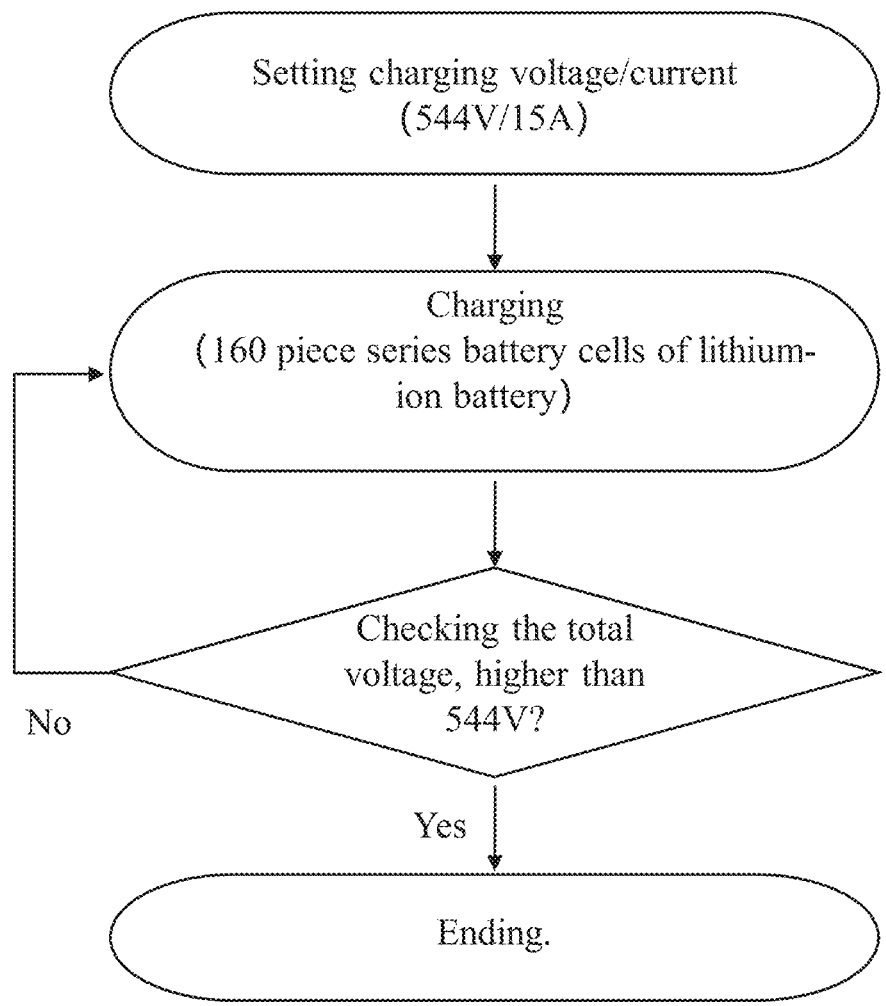
FIG. 1 shows a prior art.
Figure 2A:
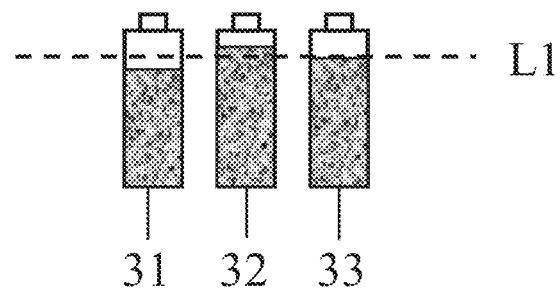
FIG. 2A shows uneven charged batteries according to the prior art.
Figure 2B:
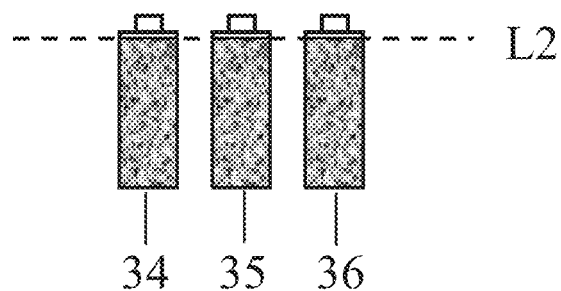
FIG. 2B shows even charged batteries according to the present invention.

FIG. 2B shows even charged batteries according to the present invention.

FIG. 2B shows that after charging with the present invention, the charging states among the series battery cells are approximately the same. For example, the voltages of the battery cells 34, 35, and 36 are all approximately equal to the voltage average line L2. Therefore, the voltage of each battery cell to be charged is approximately the same, which improves the power supply efficiency of the series battery cells.

Figure 3:
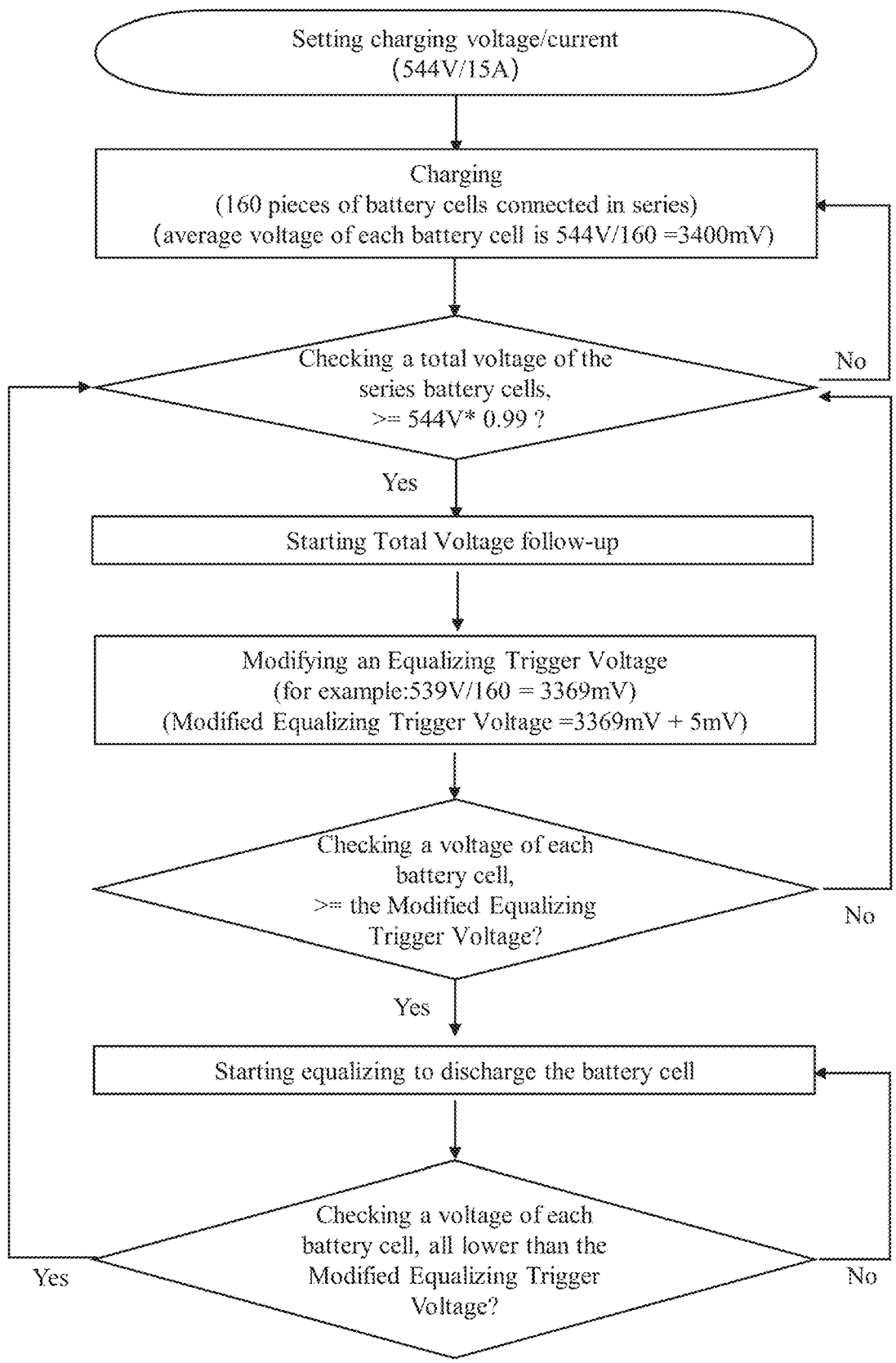
FIG. 3 shows a charging method according to the present invention.

FIG. 3 shows a charging method according to the present invention.

An equalizing trigger voltage is set to trigger a voltage equalization procedure among the series batter cells during charging so that the voltage of each battery cell can be equalized to an even voltage level according to the present invention. A battery management system (BMS) of the present invention detects the total voltage of the series battery cells time to time, and when the total voltage drifts, the "equalizing trigger voltage" is modified in real time to effectively equalizing the series battery cells.

The equalizing procedure discharges a battery cell with a voltage greater than or equal to the modified equalizing trigger voltage until its voltage lower than the modified equalizing trigger voltage.

Here it is assumed that a voltage/current of 544V/15A is set to charge 160 pieces of lithium-ion battery cells in series as an example.

FIG. 3 shows a total voltage follow-up charging method according to the present invention, comprising the steps as follows:

Step 1: setting charging voltage/current (e.g. 544V/15A):

Step 2: charging 160 pieces of lithium-ion battery cells connected in series: the average voltage of each battery cell is 544V/160=3400 mV:

Step 3: checking a total voltage of the series battery cells by a Business Management System (BMS), determining whether it is greater than or equal to a Target Voltage 544V*0.99=539V; if no, going back to step 2, and if yes, going to the next step; wherein the Target Voltage is set as follows:

Target Voltage=charging voltage*k1; wherein, the voltage adjustment k1<1: and k1 is suggested to be 0.95-0.99.

Step 4: starting Total Voltage follow-up;

Step 5: modifying an equalizing trigger voltage with reference to the total voltage:

The BMS checks the total voltage of the series battery cells to obtain a total voltage of 539V for example, the average voltage of each battery cell is calculated by 539V/160=3369 mV; and then the Equalizing Trigger Voltage is modified to be 3374 mV (3369 mV+5 mV=3374 mV); wherein the Modified Equalizing Trigger Voltage is defined as follows:

Modified Equalizing Trigger Voltage equals to ["total voltage/cell number"+k2]; wherein, the voltage adjustment k2 is "the average voltage of a single battery cell multiplied by a factor of 0.5% or less.";

Step 6: checking a voltage of each battery cell, and determining whether it is greater than or equal to the Modified Equalizing Trigger Voltage? if no, going back to step 3, If yes, going to the next step;

Step 7: starting the equalizing process to discharge the battery cell until its voltage lower than the Modified Equalizing Trigger Voltage; and Step 8: checking the voltage of each and all battery cells, determining whether all of them are lower than the Modified Equalizing Trigger Voltage? if no, going back to step 7. If yes, going back to step 3.

Figure 4:
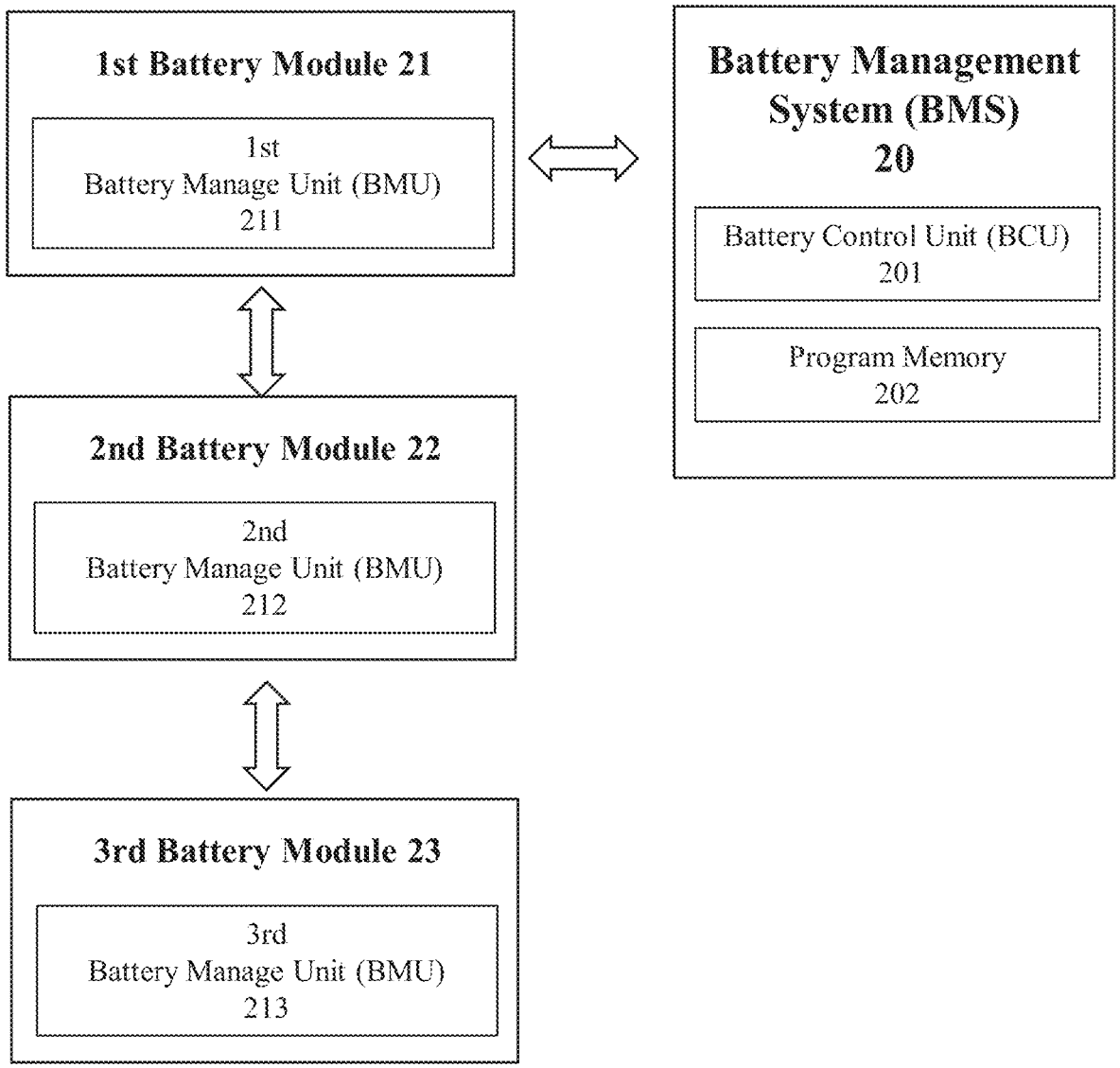
FIG. 4 shows a charging system according to the present invention.

FIG. 4 shows a charging system according to the present invention.

FIG. 4 shows a total voltage follow-up charging system for charging battery cells in series, comprises: a Battery Management System (BMS) 20, a first battery module (BMU) 21, a second battery module (BMU) 22, and a third battery Module (BMU) 23, in series connected.

The total voltage follow-up charging system comprises a battery management system (BMS), and series connected battery modules; the BMS further comprises a battery control unit (BCU) and a program memory: the BMS is electrically coupled to the series connected battery modules; each battery module further comprises a battery management unit (BMU); wherein, the program memory further comprises a control program, the control program instructs the BCU and the BMU to execute the charging method as follows:

Step 1: setting charging voltage/current to a charger;
Step 2: charging series battery cells;
Step 3: BCU causing BMU to check a total voltage of the series battery cells and to determine whether it is greater than or equal to a Target Voltage? if yes, going to the next step: wherein
the target voltage is set as follows:
target voltage=charging voltage*k1; wherein, the voltage adjustment k1<1;
Step 4: BCU causing BMU to start a Total Voltage follow-up;
Step 5: BCU causing BMU to modify an Equalizing Trigger Voltage; wherein
Modified Equalizing Trigger Voltage=(total voltage/cell number)+k2; wherein, the voltage adjustment k2 is "the average voltage of a single battery cell multiplied by a factor of 0.5% or less.";
Step 6: BCU causing BMU to check a voltage of each battery cell and to determine whether the voltage greater than or equal to the Modified Equalizing Trigger Voltage? If yes, going to the next step;
Step 7: BCU causing BMU to start equalizing procedure to discharge the battery cell until its voltage lower than the Modified Equalizing Trigger Voltage; and
Step 8: BCU causing BMU to check a voltage of each battery cell and to determine whether all the voltages of the battery cells are lower than the Modified Equalizing Trigger Voltage? If yes, going back to step 3.

Each of the battery module 21, 22, 23 further comprising a series battery cells (not shown) respectively, and the battery management system (BMS) 20 further comprising a battery control unit (BCU) 201 and a program memory 202. The program memory 202 further comprising a control program that instructs the battery control unit (BCU) 201 to execute charging method of the present invention. The battery control unit (BCU) 201 instructs the battery management units (BMU) 211, 212, 213 in the battery modules 21, 22, and 23 to perform corresponding procedures of the charging method according to the program.

The first battery module 21 further comprising a first battery management unit (BMU) 211, the BMU 211 monitors voltage, current, temperature . . . and other information inside the first battery module 21.

The second battery module 22 further comprising a second battery management unit (BMU) 212, the BMU 212 monitors voltage, current, temperature . . . and other information inside the first battery module 22.

The third battery module 23 further comprising a third battery management unit (BMU) 213, the BMU 213 monitors voltage, current, temperature . . . and other information inside the first battery module 23.

The battery modules 21, 22, 23 are arranged in series and further connected in series with the battery management system 20. The battery control unit (BCU) 201 and the battery management units 211, 221, 231 in each battery module are electrically coupled to each other.

The parameters used in the foregoing description are merely examples to facilitate readers to understand the spirit of the case, and are not used to limit the scope of rights in the case. The foregoing description discloses the preferred embodiments and design drawings of the present invention. However, the preferred embodiments and design drawings are only examples and are not intended to limit the scope of rights of the present invention.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM 20 battery management system (BMS)
201 battery control unit (BCU)
21 The first battery module
211 first battery management unit (BMU)
22 second battery module
221 second battery management unit (BMU)
23 third battery module
231 third battery management unit (BMU)
31, 32, 33, 34, 35, 36 battery cells
What is claimed is:
1. A total voltage follow-up charging method, comprising:
Step 1 to Step 8, wherein
Step 1 comprises setting a charging voltage/current to a charger;
Step 2 comprises charging, by the charger, a plurality of serially connected battery cells;
Step 3 comprises:
checking a total voltage of the serially connected battery cells,
in response to determining that the total voltage is greater than or equal to a Target Voltage, proceeding to Step 5, and otherwise, returning to Step 2,
wherein the target voltage is set as follows:
target voltage=charging voltage *k1,
where voltage adjustment k1<1;
Step 4 comprises starting Total Voltage follow-up;
Step 5 comprises determining a Modified Equalizing Trigger Voltage as follows
Modified Equalizing Trigger Voltage=(total voltage/cell number)+k2,
where cell number is a number of the plurality of serially connected battery cells charged by the charger, and
voltage adjustment k2 is an average voltage of a single battery cell multiplied by a factor of 0.5% or less;
Step 6 comprises:
checking a voltage of each battery cell,
in response to determining that the voltage of the each battery cell is greater than or equal to the Modified Equalizing Trigger Voltage, proceeding to Step 7, and
otherwise, returning to Step 3;
Step 7 comprises starting equalizing to discharge the battery cell having the voltage greater than or equal to the Modified Equalizing Trigger Voltage until the voltage of the battery cell becomes lower than the Modified Equalizing Trigger Voltage; and
Step 8 comprises:
checking the voltage of each battery cell,
in response to determining that the voltages of all of the battery cells are lower than the Modified Equalizing Trigger Voltage, returning to Step 3, and
otherwise, returning to Step 7.

2. The charging method as claimed in claim 1, wherein the voltage adjustment k1 of Step 3 is 0.95~0.99.

3. The charging method as claimed in claim 1, wherein the plurality of serially connected battery cells comprises lithium-ion battery cells.

4. A total voltage following charging system, comprising:
a battery management system; and
serially connected battery modules, wherein
the battery management system comprises a battery control unit (BCU) and a program memory;
the battery management system is electrically coupled to the serially connected battery modules;
each battery module comprises a battery management unit (BMU);
the program memory comprises a control program which instructs the BCU and the BMU of each battery module to execute a charging method for charging a plurality of serially connected battery cells in the battery module, the charging method comprising: Step 1 to Step 8, wherein
Step 1 comprises setting a charging voltage/current to a charger;
Step 2 comprises charging, by the charger, the plurality of serially connected battery cells;
Step 3 comprises:
the BCU causing the BMU to check a total voltage of the serially connected battery cells,
in response to determining that the total voltage is greater than or equal to a Target Voltage, proceeding to Step 5, and otherwise, returning to Step 2,
wherein the target voltage is set as follows:
target voltage=charging voltage *k1,
where voltage adjustment k1<1;
Step 4 comprises the BCU causing the BMU to start Total Voltage follow-up;
Step 5 comprises the BCU causing the BMU to determine a Modified Equalizing Trigger Voltage as follows
Modified Equalizing Trigger Voltage=(total voltage/cell number)+k2,
where cell number is a number of the plurality of serially connected battery cells charged by the charger, and
voltage adjustment k2 is an average voltage of a single battery cell multiplied by a factor of 0.5% or less;
Step 6 comprises:
the BCU causing the BMU to check a voltage of each battery cell,
in response to determining that the voltage of the each battery cell is greater than or equal to the Modified Equalizing Trigger Voltage, proceeding to Step 7, and otherwise, returning to Step 3;
Step 7 comprises the BCU causing the BMU to start equalizing to discharge the battery cell having the voltage greater than or equal to the Modified Equalizing Trigger Voltage until the voltage of the battery cell becomes lower than the Modified Equalizing Trigger Voltage; and
Step 8 comprises:
the BCU causing the BMU to check the voltage of each battery cell,
in response to determining that the voltages of all of the battery cells are lower than the Modified Equalizing Trigger Voltage, returning to Step 3, and
otherwise, returning to Step 7.

5. The charging system as claimed in claim 4, wherein the plurality of serially connected battery cells comprises lithium-ion battery cells.

* * * * *